United States Patent [19]
Manada et al.

[11] Patent Number: 5,463,977
[45] Date of Patent: Nov. 7, 1995

[54] METHOD OF AND APPARATUS FOR EPITAXIALLY GROWING CHEMICAL COMPOUND CRYSTAL

[75] Inventors: Nobuaki Manada, 1-24, Yagiyamaminami 1-chome, Taihaku-ku, Sendai-shi, Miyagi-ken; Junji Ito, Miyagi; Toru Kurabayashi, 9-23, Yagiyamaminami 1-chome, Taihaku-ku, Sendai-shi, Miyagi-ken; Jun-ichi Nishizawa, Sendai, all of Japan

[73] Assignees: Research Development Corporation, Tokyo; Nobuaki Manada, Miyagi; Toru Kurabayashi, Miyagi; Jun-Ichi Nishizawa, Miyagi, all of Japan

[21] Appl. No.: 91,747

[22] Filed: Jul. 15, 1993

Related U.S. Application Data

[60] Continuation of Ser. No. 799,132, Nov. 27, 1991, abandoned, which is a division of Ser. No. 617,554, Nov. 26, 1990, abandoned.

[30] Foreign Application Priority Data

Nov. 24, 1989 [JP] Japan ................... 1-305873

[51] Int. Cl.[6] .................................................. C30B 25/16
[52] U.S. Cl. .................. 117/85; 117/86; 117/89; 117/105; 117/108
[58] Field of Search ................... 117/85, 86, 108, 117/89, 105; 422/105

[56] References Cited

U.S. PATENT DOCUMENTS

| | | | |
|---|---|---|---|
| 3,915,765 | 10/1975 | Cho et al. | 156/610 |
| 4,159,919 | 7/1979 | McFee et al. | 156/610 |
| 4,383,872 | 5/1983 | Roberts | 156/610 |
| 4,525,376 | 6/1985 | Edgerton | 427/10 |
| 4,575,462 | 3/1986 | Dobson et al. | 156/601 |
| 4,812,650 | 3/1989 | Eckstein et al. | 156/601 |
| 4,931,132 | 6/1990 | Aspnes | 422/245 |
| 5,091,320 | 2/1992 | Aspnes | 437/8 |

FOREIGN PATENT DOCUMENTS

| | | |
|---|---|---|
| 0101049 | 2/1984 | European Pat. Off. . |
| 0233610 | 8/1987 | European Pat. Off. . |
| WO87/005700 | 9/1987 | WIPO . |
| WO89/06354 | 7/1989 | WIPO ................... 156/601 |

OTHER PUBLICATIONS

Journal of the Electrochemical Society vol. 121, No. 9 Sep. 1974 pp. 1233-1237 Sugawara et al "In situ Monitoring of Film Deposition Using HE-NE Laser System".

Primary Examiner—Robert Kunemund
Attorney, Agent, or Firm—Nixon & Vanderhye

[57] ABSTRACT

In a method of and an apparatus for epitaxially growing a chemical-compound crystal, a plurality of raw-material gasses are alternately introduced into a closed chamber of a crystal growing device to grow the crystal placed within the closed chamber. At growing of the crystal, a light from a light source is emitted to a crystal growing film of the crystal. Intensity of a light reflected from the crystal growing film and received by a photo detector is measured. Charge amounts of the respective raw-material gasses are controlled by a control system on the basis of a change in the reflected-light intensity, thereby controlling a growing rate of the growing film.

6 Claims, 6 Drawing Sheets

1

METHOD OF AND APPARATUS FOR EPITAXIALLY GROWING CHEMICAL COMPOUND CRYSTAL

This is a continuation of application Ser. No. 07/799,132, filed Nov. 27, 1991, now abandoned, which is a division of application Ser. No. 07/617,554, filed Nov. 26, 1990 now abandoned.

BACKGROUND OF THE INVENTION

The present invention relates to methods of and apparatuses for epitaxially growing a chemical-compound crystal, in which a plurality of raw-material gasses are alternately introduced into a closed chamber of a crystal growing device to grow the crystal and, more particularly, to a method of and an apparatus for epitaxially growing a chemical-compound crystal, in which a growing rate of a growing film of the chemical-compound crystal is controlled at growing of the crystal.

In an epitaxial growing method for a chemical-compound crystal, it is very important to control a growing rate of a growing film of the crystal at growing of the crystal. Conventionally, in a molecular-beam epitaxial growing method and a migration enhanced epitaxial growing method, vibration of a reflection high-energy electron diffraction (hereinafter referred to as "RHEED") is utilized to control the growing rate of the growing film of the order of a monomolecular layer. This is reported in the paper, Jpn. J. Appl. Phys. Vol 23, No. 9 PPL 657–L659 (1984); T. Sakamoto, et al., for example.

In practice, the crystal is grown while rotating a crystal substrate, in order to secure uniformity in a plane of the crystal film.

In the case where the crystal is grown while rotating the crystal substrate as described above, a direction of a crystal axis and a direction of the high-energy electron beam change due to the rotation of the crystal substrate. Thus, it is practically impossible to control the thickness of the growing film of the crystal by the RHEED.

In the existing circumstances, accordingly, the thickness of the growing film of the crystal is controlled by the same conditions as growing conditions which are obtained when the crystal substrate is fixed against rotation. For this reason, it is required to regulate or control charge amounts of the respective raw-material gasses into the crystal growing device by crucibles or the like which are controlled in temperature extremely precisely.

Further, there is the following problems. That is, influence of emission of the high-energy electron beam to the surface of the growing film gives rise to defects in the crystal. Because of the use of the electron beam, the interior of the crystal growing device must be maintained at super high vacuum.

SUMMARY OF THE INVENTION

It is an object of the invention to provide a method of and an apparatus for epitaxially growing a chemical-compound crystal, in which it is possible to secure uniformity in a plane of a crystal film of the crystal, in which any no bad influence is exerted on the crystal at growing of the crystal, and which are applicable to a wide range of pressures without limitation to super high vacuum though it is of course that the method and the apparatus can be applied to the super high vacuum.

According to the invention, there is provided a method of epitaxially growing a chemical-compound crystal, comprising the steps of:

placing the chemical-compound crystal within a closed chamber of a crystal growing device;

alternately introducing a plurality of raw-material gasses into the closed chamber to grow the crystal;

at growing of the crystal, emitting a light to a crystal growing film of the crystal from a predetermined direction;

measuring intensity of a light reflected from the crystal growing film; and controlling charge amounts of the respective raw-material gasses on the basis of a change in the reflected-light intensity, thereby controlling a growing rate of the growing film.

According to the invention, there is further provided an apparatus for epitaxially growing a chemical-compound crystal, comprising:

a crystal growing device having defined therein a closed chamber, the chemical-compound crystal being placed within the closed chamber;

means for alternately introducing a plurality of raw-material gasses into the closed chamber to grow the crystal;

incident window means provided at a periphery of the closed chamber;

light-source means arranged on the outside of the closed chamber in facing relating to the incident window means, for emitting a light to a crystal growing film of the crystal through the incident window means;

extracting window means provided at the periphery of the closed chamber;

light-receiving means arranged on the outside of the closed chamber in facing relation to the extracting window means, for receiving a light reflected from the crystal growing film of the crystal through the extracting window means;

means for measuring intensity of the reflected light; and control means for controlling charge amounts of the respective raw-material gasses on the basis of a change in the reflected-light intensity, thereby controlling a growing rate of the growing film of the crystal.

With the above arrangement of the invention, since the intensity of the light reflected from the growing film is measured, any no bad influence is exerted on the inside of the crystal at growing of the crystal.

Further, since the light is used, it is not required to retain or maintain the interior of the crystal growing device at super high vacuum unlike the conventional RHEED, though it is of course that the interior of the crystal growing device may be maintained at the super high vacuum. Since the light is emitted to the crystal growing film from the outside of the closed chamber, pressure within the closed chamber does not become an issue, so that it is possible to apply the method and apparatus to a wide range of pressures including the normal pressure or pressure higher than the same.

Furthermore, since the conventional RHEED is due to electron-beam diffraction, it is necessary to align the direction of the crystal axis and the direction of the high-energy electron beam with each other, so that it is impossible to grow the crystal while rotating the crystal substrate. In the method and the apparatus according to the invention, however, since the change in the reflected-light intensity has no relation to the crystal axis, the crystal substrate may be or may not be rotated at growing of the crystal. Thus, it is possible to secure uniformity in the plane of the crystal-film.

As described above, according to the method and the apparatus of the invention, the use of the light, which is low in cost, enables the growing rate of the growing film to easily be controlled at accuracy equal to or lower than the monomolecular layer.

DETAILED DESCRIPTION OF THE DRAWINGS

Figure 6:
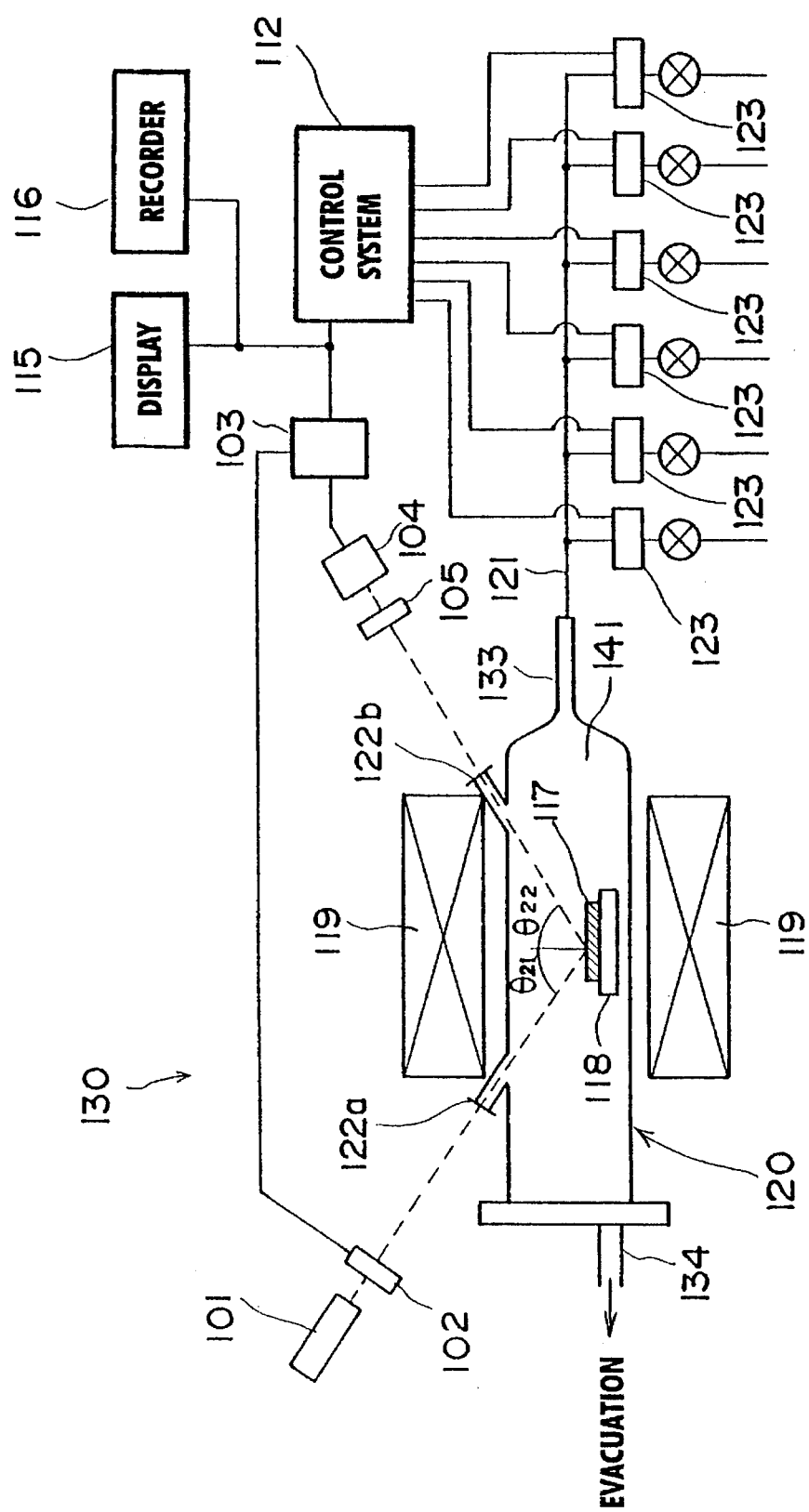
Figure 7:
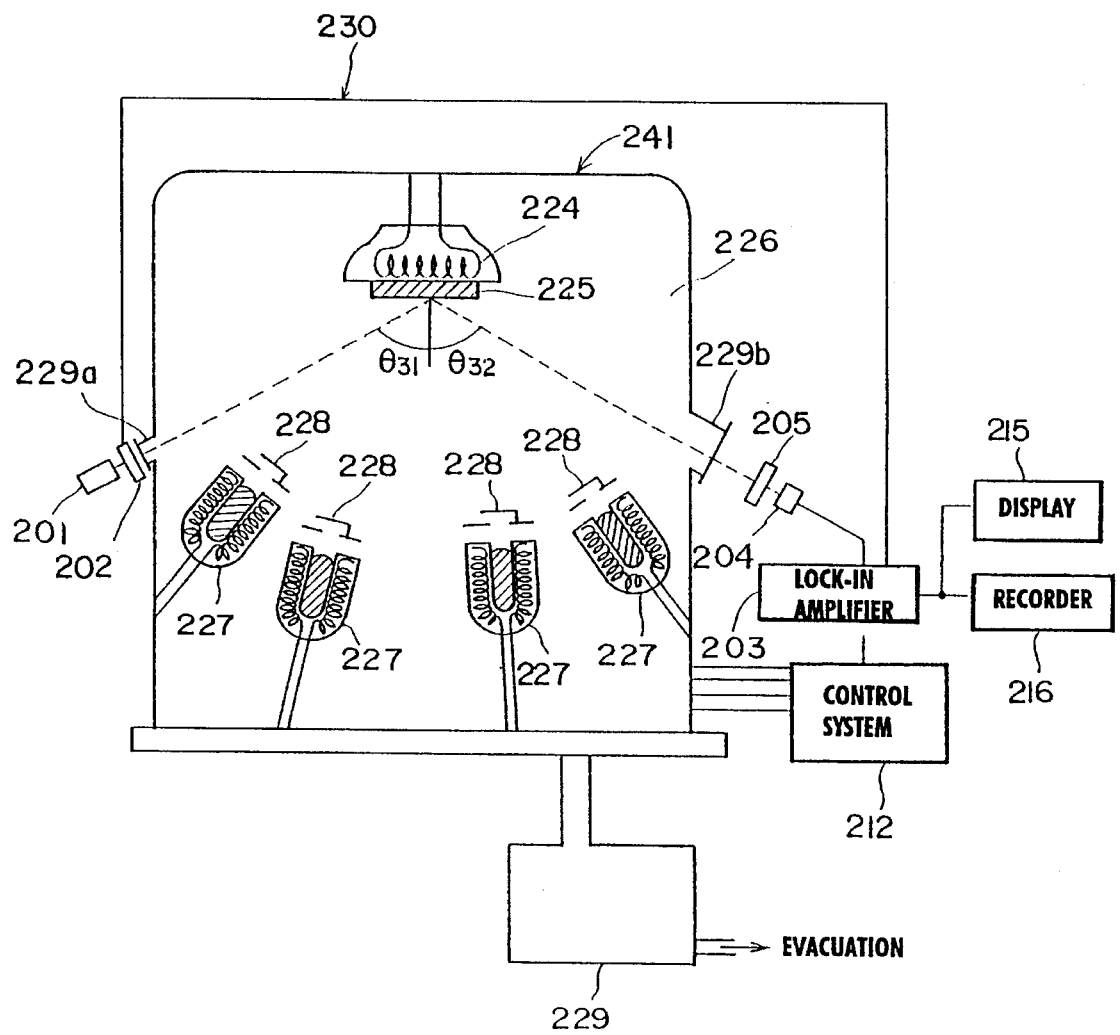

FIG. 6 is a schematic view of an epitaxial growing apparatus for carrying out the epitaxial growing method for the chemical-compound crystal, according to a second embodiment of the invention; and FIG. 7 is a schematic view of an epitaxial growing apparatus for carrying out the epitaxial growing method for the chemical-compound crystal, according to a third embodiment of the invention, the epitaxial growing apparatus comprising a molecular-beam epitaxial device.

DESCRIPTION OF THE EMBODIMENTS

Figure 1:
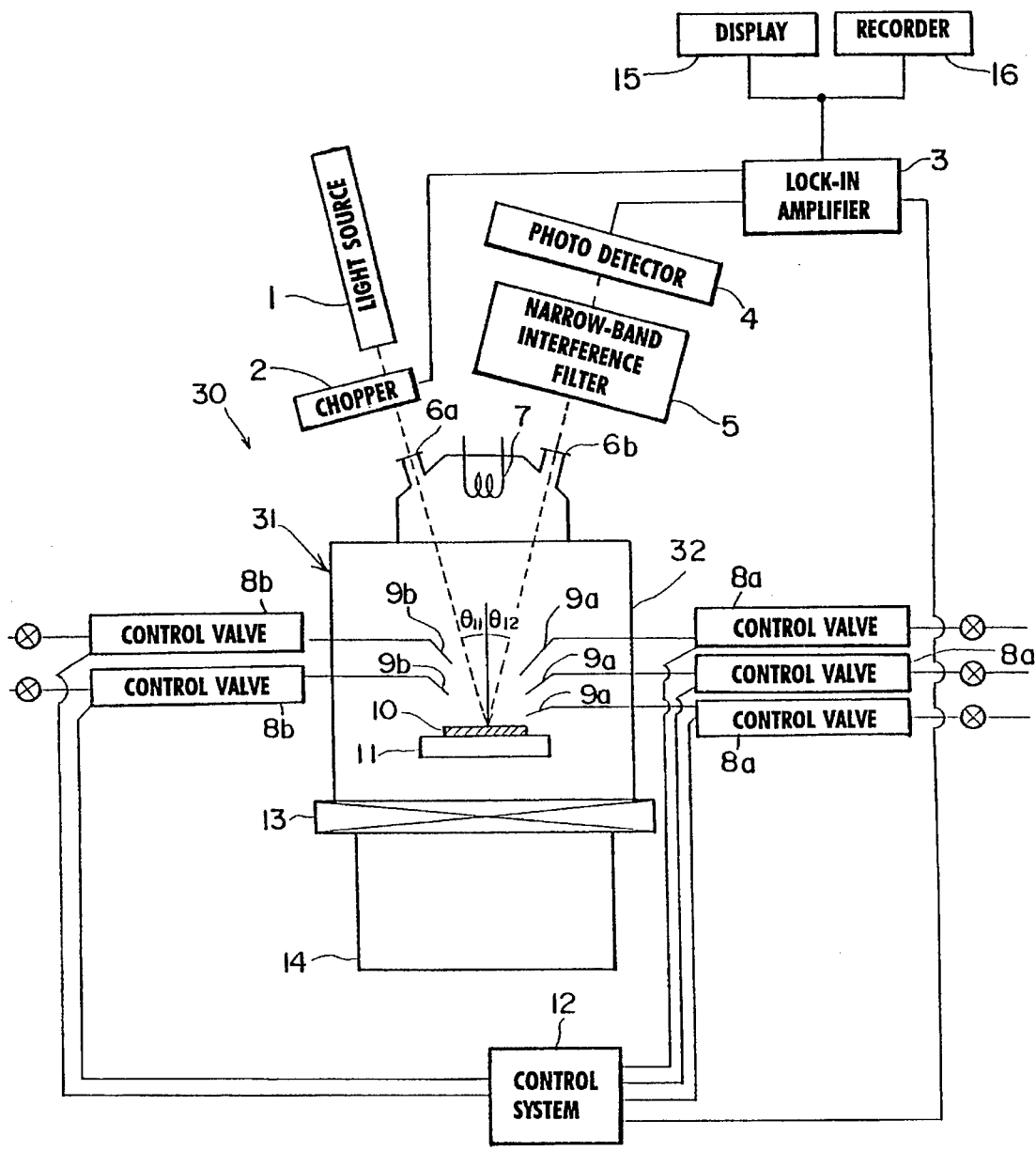
FIG. 1 is a schematic view of an epitaxial growing apparatus for carrying out an epitaxial growing method for a chemical-compound crystal, according to a first embodiment of the invention, the epitaxial growing apparatus comprising a GaAs molecular-layer epitaxial growing device.

Referring first to FIG. 1, there is shown an epitaxial growing apparatus which comprises a GaAs molecular-layer epitaxial growing device 30. The epitaxial growing device 30 is reported in a paper [J. Nishizawa, H. Abe and T. Kurabayashi; J. Electrochem. Soc. 132 (1985) 1197–1200] written by Junichi Nishizawa et el, for example.

As shown in FIG. 1, the GaAs molecular-layer epitaxial growing device 30 comprises a hermetic or closed container 31 in which a closed crystal growing chamber 32 is defined. For example, pressure within the crystal growing chamber 32 is evacuated, for the first time, to $10^{-6}$ to $10^{-11}$ Torr and, subsequently, chemical-compound gas that is a raw material is introduced into the crystal growing chamber 32 at $10^{-1}$ to $10^{-7}$ Tort with predetermined sequence while the crystal growing chamber 32 is evacuated. A gate valve 13 is arranged at a location below the closed container 31. A vacuum evacuation device 14 such as a turbo molecular pump or the like is arranged at a location below the gate valve 13. The crystal growing chamber 32 is arranged at a location above the gate valve 18. A GaAs single-crystal substrate susceptor 11 and a GaAs single-crystal substrate 10 are accommodated within the crystal growing chamber 82. Further, within the crystal growing chamber 82, a plurality of raw-material-gas introducing nozzles 9a and a plurality of impurity-gas introducing nozzles 9b are arranged in opposed relation to each other, in facing relation to the GaAs single-crystal substrate 10. The raw-material-gas introducing nozzles 9a and the impurity-gas introducing nozzles 9b are provided with their respective control valves 8a and 8b.

These control valves 8a and 8b are connected to a control system 12.

Furthermore, a GaAs single-crystal substrate heating lamp 7 is arranged at an upper portion of the crystal growing chamber 82. An incident window 6a and an extracting window 6b, through which a light can pass, are provided at a periphery of the crystal growing chamber 82 and are arranged respectively on both sides of the GaAs single-crystal substrate heating lamp 7. The incident window 6a and the extracting window 6b are arranged as follows. That is, the incident window 6a and the extracting window 6b are set in angle such that the light passing through the incident window 6a and the extracting window 6b is brought to a predetermined incident angle $\theta_{11}$ and a predetermined reflecting angle $\theta_{12}$ with respect to the GaAs single-crystal substrate 10.

That is, the arrangement is such that the light from a light source 1 is emitted to a growing film of the GaAs single-crystal substrate 10 from a predetermined direction. The light source 1 is arranged on the outside of the incident window 6a in facing relation thereto. The light source 1 is a source of a parallel beam, and is selected from a He-Ne laser, a semiconductor laser, a light-emitting diode, a mercury lamp and an argon ion laser. A chopper 2 for chopping the light is arranged between the incident window 6a and the light source 1. Moreover, a photo detector 4 for the light reflected from the GaAs single crystal substrate 10 is arranged on the outside of the extracting window 6b in facing relation thereto. A narrow-band interference filter 5 for removing a stray light from the reflected light is arranged between the extracting window 6b and the photo detector 4.

The chopper 2 and the photo detector 4 are connected to a lock-in amplifier 3. The lock-in amplifier 3 is provided with a display 15 and a recorder 16. The lock-in amplifier 3 is connected to the control system 12.

The epitaxial growing method for the chemical-compound crystal, according to the first embodiment of the invention, is carried out by the use of the GaAs molecular-layer epitaxial growing device 30 as follows.

First, the control valves 8a and 8b for the impurity gas and the raw-material gas are controlled by the control system 12. By doing so, the raw-material gas containing Ga and the raw-material gas containing As are alternately introduced into the crystal growing chamber 32 and are directed onto the GaAs single-crystal substrate 10 which is controlled in temperature by the GaAs single-crystal substrate heating lamp 7, so that GaAs is epitaxially grown.

The reflected-light intensity at the GaAs crystal surface is measured as follows. That is, first, the light from the light source 1 arranged on the outside of the closed container 31 is chopped by the chopper 2. The light chopped is emitted to the GaAs single crystal through the incident window 6a. The light reflected is detected by the photo detector 4 such as a Si photodiode or the like, through the other extracting window 6b. The filter 5 is arranged between the photo detector 4 and the extracting window 6b, and removes the stray light from the light incident upon the photo detector 4 before the detection. A detecting output from the photo detector 4 is processed in signal by the lock-in amplifier 3. Subsequently, outputs are successively issued from the lock-in amplifier 3 to the control system 12, the display 15 and the recorder 16.

Figure 2:
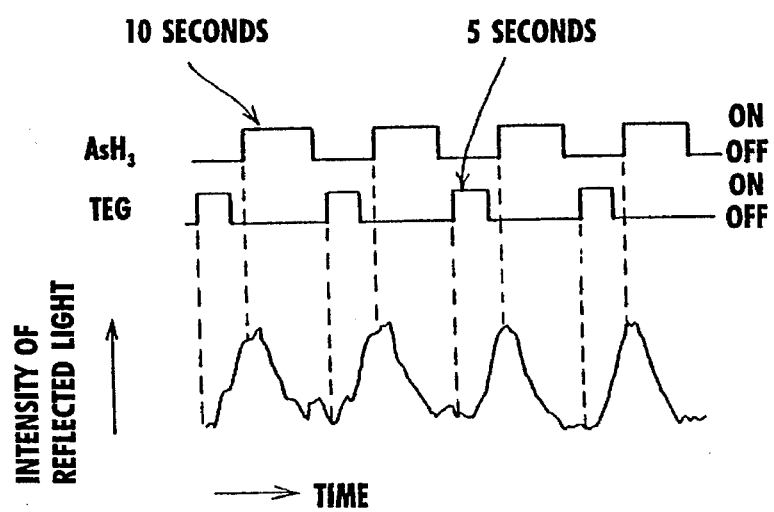
FIG. 2 is a view showing a change in reflected-light intensity observed at crystal growing of GaAs by the use of the epitaxial growing apparatus illustrated in FIG. 1.

FIG. 2 shows introducing sequence of the raw-material gasses and the change in the reflected-light intensity observed when GaAs is epitaxially grown by the GaAs molecular-layer epitaxial growing device 30 illustrated in FIG. 1.

As shown in FIG. 2, it will be seen that the reflected-light intensity increases with introduction of triethylgallium (TEG) which is used as the raw-material gas containing Ca, while the reflected-light intensity decreases with introduction of arsine (AsH₃) which is used as the raw-material gas containing As.

Figure 3:
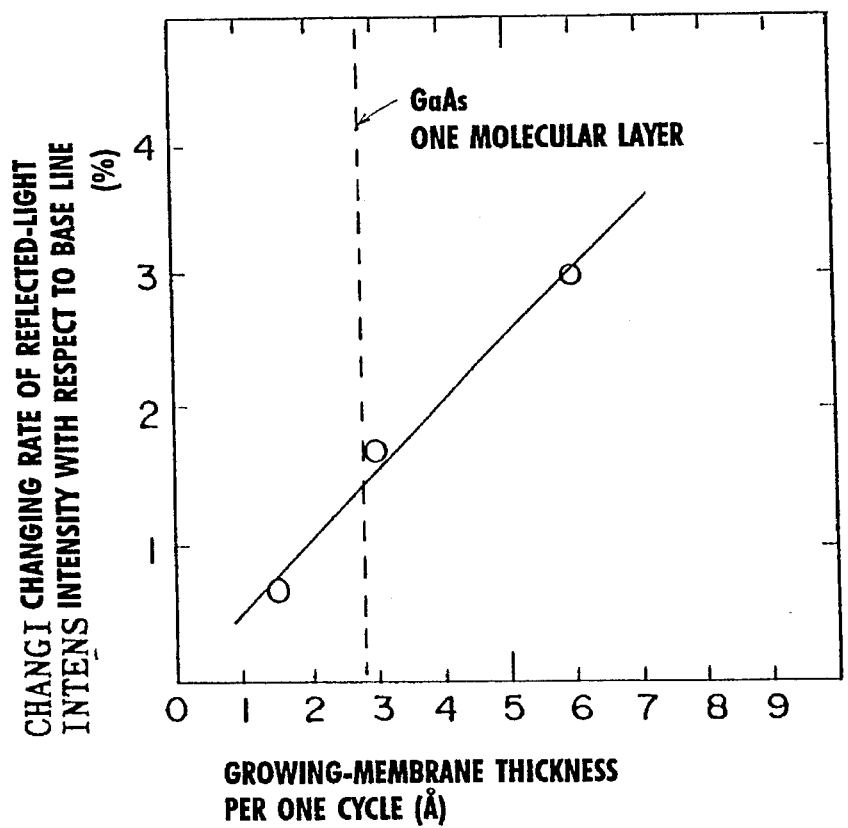
FIG. 3 is a graphical representation of a mutual relation between a changing rate of the reflected-light intensity and the growing-film thickness per one cycle.

Further, FIG. 3 shows the mutual relation between the growing-film thickness per one cycle and a changing rate of the reflected-light intensity with respect to a base line which is observed when GaAs is epitaxially grown by the GaAs molecular-layer epitaxial growing device 30 illustrated in FIG. 1.

The above-described mutual relation between the growing-film thickness per one cycle and the changing rate of the reflected-light intensity is utilized to measure a change of the reflected-light intensity illustrated in FIG. 2. On the basis of the measurement value, the introducing pressure and the introducing time of the raw-material gasses are regulated or controlled. The growing rate of the growing film is controlled at accuracy equal to or lower than the monomolecular layer during growth of the crystal.

For example, in FIG. 1, the growing rate of the growing film is controlled at accuracy equal to or lower than the monomolecular layer such that the output from the lock-in amplifier 3 is inputted to the control system 12, the desirable change in intensity corresponding to the growing-film thickness per one cycle is beforehand stored in the control system 12, and introduction of the raw-material gasses stops when a change in the output from the lock-in amplifier 3 reaches a value of the stored intensity change. Thus, it is possible to produce a desirable growing-film thickness.

Figure 4:
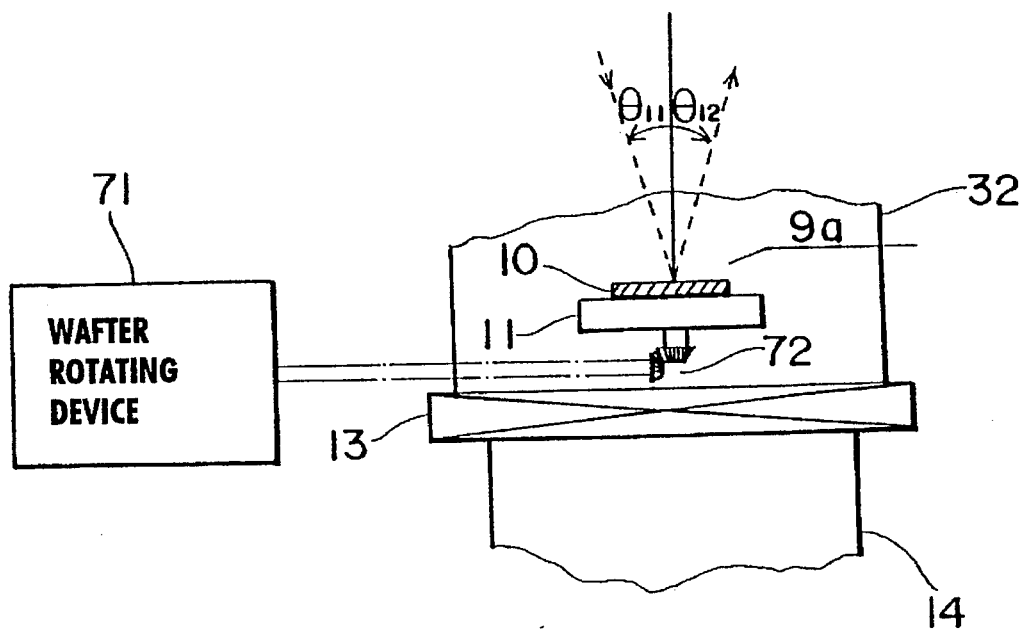
FIG. 4 is a schematic fragmentary view of a first modification of the epitaxial growing apparatus illustrated in FIG. 1.

In the apparatus illustrated in FIG. 1, the substrate susceptor 11 is fixedly mounted to the periphery of the crystal growing chamber 32. As illustrated in FIG. 4 which shows a first modification of the epitaxial growing apparatus, however, the substrate susceptor 11 may be connected to a wafer rotating device 71 through a gear train 72, so that the substrate 10 on the substrate susceptor 11 can be rotated about the vertical axis by the wafer rotating device 71. In the first modification illustrated in FIG. 4, even if the crystal is grown while rotating the crystal substrate, a direction of the light from the light source 1 and a direction of the light reflected from the substrate 10 do not change with respect to the vertical crystal axis. Thus, it is possible to control the thickness of the growing film of the crystal accurately.

Figure 5:
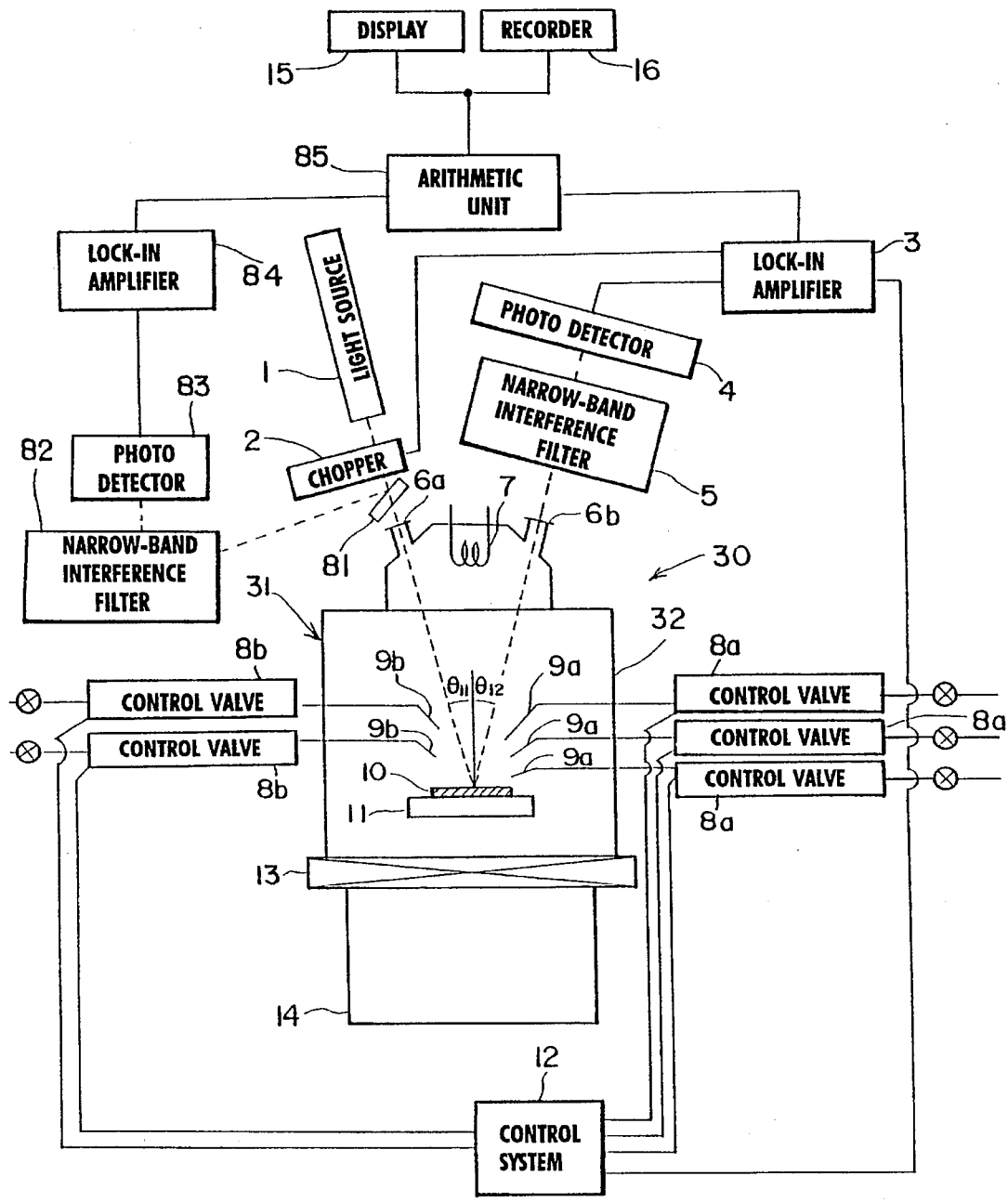
FIG. 5 is a schematic view of a second modification of the epitaxial growing apparatus illustrated in FIG. 1.

FIG. 5 shows a second modification of the apparatus illustrated in FIG. 1. In the second modification illustrated FIG. 5, a half-transparent mirror or a half-silvered mirror 81 is arranged between the chopper 2 and the incident window 6a. A photo detector 83 is arranged in facing relation to the half-silvered mirror 81, and a narrow-band interference filter 82 is arranged between the half-silvered mirror 81 and the photo detector 83. The photo detector 83 is connected to a lock-in amplifier 84. The lock-in amplifier 84 and the lock-in amplifier 3 are connected to an arithmetic unit 85. The display 15 and the recorder 16 are connected to the arithmetic unit 85.

In the epitaxial growing apparatus illustrated in FIG. 5, a part of the light emitted from the light source 1 is reflected by the half-silvered mirror 81. The remaining light passes through the half-silvered mirror 81 and is incident upon the substrate 10 through the incident window 6a. That is, the light part is extracted from the light incident upon the substrate 10. The light part serves as a reference light. The light part reflected by the half-silvered mirror 81 is incident upon the photo detector 83 through the narrow-band interference filter 82. The lock-in amplifier 84 connected to the photo detector 83 issues an output on the basis of the light incident upon the photo detector 83. At the arithmetic unit 85, the reference light is compared with The reflected light incident upon the photo detector 4, in order to reduce instability in output from the light source 1. Thus, it is possible to control the growing rate at further high accuracy.

Referring next to FIG. 6, there is shown an epitaxial growing apparatus according to a second embodiment of the invention. The epitaxial growing apparatus comprises a crystal growing device 130 which is one selected from a MO-CVD (metal organic-chemical vapor deposition) device, a chloride-method gas-phase growing device and a hydride epitaxial growing device. These devices are different from each other in gasses utilized. That is, AsCl₃ and H₂ are used in the chloride-method gas-phase growing device. HCl, H₂, As₂ and As₄ are utilized in the hydride epitaxial growing device. Ga(CH₃)₃, AsH₃ and H₂ are employed in the MO-CVD device.

As shown in FIG. 6, the crystal growing device 130 comprises a cylindrical quartz reaction tube 120 in which a closed chamber 141 is defined. Pressure within the closed chamber 141 is maintained at the normal pressure or atmospheric pressure to 10⁻² Tort, for example. The quartz reaction tube 120 has its one end provided with a gas introduction port 133, and the other end provided with a gas discharge port 134. Connected to the gas introduction port 133 is a supply nozzle 121 for gasses including GaAs crystal-growing raw material gasses and dopant. A plurality of control valves 123 are connected to the gas supply nozzle 121 and are also connected to a control system 112.

Further, a quartz susceptor 118 and a GaAs single-crystal substrate 117 are accommodated in the quartz reaction tube 120, that is, are placed within the closed chamber 141. A cylindrical heater 119 is arranged about the quartz reaction tube 120. An incident window 122a and an extraction window 122b, through which a light can pass, are arranged at their respective locations on both sides of the heater 119 and above the same. The incident window 122a and the extracting window 122b are arranged as follows. That is, both the windows 122a and 122b are set in angle such that the light passing through the incident window 122a and the extracting window 122b is brought to a predetermined incident angle $\theta_{21}$ and a predetermined reflecting angle $\theta_{22}$ with respect to the GaAs single-crystal substrate 117.

That is, the arrangement is such that the light from a light source 101 is emitted to a growing film of the GaAs single-crystal substrate 117 from a predetermined direction. The light source 101 is arranged on the outside of the incident window 122a in facing relation thereto. The light source 101 is a source of a parallel beam, and is selected from a He-Ne laser, a semiconductor laser, a light-emitting diode, a mercury lamp and an argon ion laser. A chopper 102 for chopping the light from the light source 101 is arranged between the incident window 122a and the light source 101. Moreover, a photo detector 104 for a light reflected from the substrate 117 is arranged on the outside of the extracting window 122b in facing relation thereto. A narrow-band interference filter 105 for removing a stray light from the reflected light is arranged between the extracting window 122b and the photo detector 104.

The chopper 102 and the photo detector 104 are connected to a lock-in amplifier 103. The lock-in amplifier 103 is provided with a display 115 and a recorder 116. The lock-in amplifier 103 is connected to the control system 112.

The crystal growing apparatus constructed as described above is used to carry out the epitaxial growing method for the chemical-compound crystal, according to the second embodiment of the invention, as follows.

First, gas introduction time and evacuation time of the quartz reaction tube 120 are controlled by the control system 112. The raw-material gas containing Ga and the raw-material gas containing As are alternately supplied onto the GaAs single crystal substrate 117. In this manner, GaAs is epitaxially grown.

At growth of the crystal, the light from the light source 101 is reflected by the GaAs single-crystal substrate 117, and intensity of the reflected light is measured by the photo detector 104 such as a Si photodiode or the like. A detection output of the reflected-light intensity from the photo detector 104 is processed in signal by the lock-in amplifier 103. Subsequently, outputs are successively issued from the lock-in amplifier 103 to the display 115 and the recorder 116.

Further, the output from the lock-in amplifier 103 is inputted also to the control system 112. If a change in the reflected-light intensity corresponding to the desirable growing-film thickness per one cycle is reached, the control valve 123 is closed to stop introduction of the GaAs crystal growing raw-material gasses and the gas containing the dopant, thereby controlling the growing rate of the growing-film thickness. Thus, the desirable growing-film thickness is produced.

In connection with the above, the method according to the second embodiment of the invention can equally be applied to gas-phase growth using $GaCl_3$ and $AsH_3$, chloride-method gas-phase growth due to Ga—$AsCl_3$— $H_2$, and hydride-method gas-phase growth using Ga—$AsH_3$— HCl.

Although not shown, it is needless to say that the arrangements illustrated in FIGS. 4 and 5 are equally applicable to the arrangement illustrated in FIG. 6.

Referring next to FIG. 7, there is shown an epitaxial growing apparatus according to a third embodiment of the invention. The epitaxial growing apparatus comprises a molecular-beam epitaxial growing device 230 which is one of GaAs gas-phase growing devices.

As shown in FIG. 7, the molecular-beam epitaxial growing device 230 comprises a hermetic or closed container 241 in which a super-high vacuum growing chamber 226 is defined. Pressure within the super-high vacuum chamber 226 is maintained at $10^{-4}$ to $10^{-11}$ Torr, for example. A vacuum evacuation device 229 such as an ion pump, a turbo molecular pump or the like is connected to a bottom of the super-high vacuum growing chamber 226. A substrate heater 224 is arranged at a ceiling within the super-high vacuum growing chamber 226. A GaAs single-crystal substrate 225 is arranged adjacent the substrate heater 224 and facing downwardly.

Further, a plurality of raw-material heating crucibles 227 are fixedly supported on the bottom within the super-high vacuum growing chamber 226. A plurality of shutters 228 for controlling supply of molecular beams or raw-material gasses are provided respectively at openings of the respective raw-material heating crucibles 227. An incident window 229a and an extraction window 229b, through which a light can pass, are arranged respectively at opposed side walls of the super-high vacuum growing chamber 226. The incident window 229a and the extracting window 229b are arranged as follows. That is, the incident window 229a and the extracting window 229b are set in angle such that the light passing through the incident window 229a and the extracting window 229b is brought to a predetermined incident angle $\theta_{31}$ and a predetermined reflecting angle $\theta_{32}$ with respect to the GaAs single-crystal substrate 225.

That is, the arrangement is such that a light from a light source 201 is emitted to a growing film of the GaAs single-crystal substrate 225 from a predetermined direction. The light source 201 is arranged on the outside of the incident window 229a in facing relation thereto. The light source 201 is a source of a parallel beam, and is selected from a He-Ne laser, a semiconductor laser, a light-emitting diode, a mercury lamp and an argon ion laser. A chopper 202 for chopping the light is arranged between the incident window 229a and the light source 201.

Moreover, a photo detector 204 for the light is arranged on the outside of the extracting window 229b in facing relation thereto. A narrow-band interference filter 205 for removing a stray light from the light reflected from the substrate 225 is arranged between the extracting window 229b and the photo detector 204. The chopper 202 and the photo detector 204 are connected to a lock-in amplifier 203. The lock-in amplifier 203 is provided with a display 215 and a recorder 216. The lock-in amplifier 203 is connected to a control system 212.

Furthermore, the control system 212 is connected to an electric system for the super-high vacuum growing chamber 226. The electric system is connected in line to attachment devices such as the shutters 228 and the like which are mounted within the super-high vacuum growing chamber 226.

The epitaxial growing apparatus is used to carry out the epitaxial growing method for the chemical-compound crystal, according to the third embodiment of the invention, as follows.

First, opening and closing operation of the shutters 228 is controlled by the control system 212. The raw materials within the respective crucibles 227 are heated respectively by the heaters 227, and the raw-material gasses are emitted from the crucibles 227 toward the substrate 225 when the shutters 228 are moved to their respective open positions. The raw-material gasses of respective Ga and As are alternately supplied onto the GaAs single-crystal substrate 225. In this manner, GaAs is epitaxially grown.

The reflected-light intensity is measured as follows. That is, first, the light from the light source 201 arranged on the outside of the molecular-beam epitaxial growing device 230 is chopped by the chopper 202. Subsequently, the light is applied to the GaAs single-crystal substrate 225 through the incident window 229a. The light reflected from the substrate 225 is emitted toward the photo detector 204 through the extracting window 229b, and is measured by the photo detector 204 such as a Si photodiode or the like which is arranged on the outside of the molecular-beam epitaxial growing device 230. At the measurement due to the photo detector 204, a stray light is attenuated by the narrow-band interference filter 205 which is arranged between the photo detector 204 and the extracting window 229b.

A detection output from the photo detector 204 is processed in signal by the lock-in amplifier 203. Subsequently, outputs are successively issued from the lock-in amplifier 203 to the display 215 and the recorder 216.

Simultaneously, the output from the lock-in amplifier 203 is also inputted to the control system 212. The desirable changing rate in the reflected-light intensity corresponding to the growing-film thickness per one cycle is stored in the control system 212. If a changing rate of the output from the lock-in amplifier 203 reaches a value of the stored desirable changing rate, the shutters 228 are closed.

Although not shown, it is needless to say that the arrangements illustrated in FIGS. 4 and 5 are equally applicable to the arrangement illustrated in FIG. 7.

As described above, in the first to third embodiments of the invention, the growing rate of the growing-film thickness is controlled during growth of the crystal in the manner mentioned previously. Thus, it is possible to produce a desirable crystal-film thickness at accuracy equal to or lower than a monomolecular layer.

Furthermore, since the conventional RHEED is due to electron-beam diffraction, it is required that the direction of the crystal axis and the direction of the high-energy electron beam are aligned with each other. Thus, it is impossible for the conventional RHEED to grow the crystal while rotating the GaAs single-crystal substrate 10, 117 or 225. In the method and the apparatus according to the invention, however, since the change in the reflected-light intensity has no relation to the crystal axis, it is possible to grow the crystal while rotating the GaAs single-crystal substrate 10, 117 or 225. Thus, it is possible to secure uniformity in the plane of the crystal film.

What is claimed is:

1. A method of epitaxially growing a chemical-compound crystal in order to generate adsorption and surface reaction per a single molecular layer alternately and independently of each other, said method comprising the steps of:

(a) alternately introducing raw-material gases into a crystal growing vacuum chamber to grow a crystal film monolayer by monolayer by using adsorption and surface reaction of said gases;

(b) during the growth of said crystal, emitting a light onto the growing crystal film of said crystal;

(c) measuring the intensity of a light reflected from the growing crystal film; and (d) controlling the adsorption amounts of the respective raw-material gases on the growing surface on the basis of a change in the reflected-light intensity, thereby controlling the growth rate of the growing film and the film thickness.

2. The method according to claim 1, wherein said light emitted on to said growing crystal film is a parallel beam.

3. The method according to claim 2, wherein said parallel beam is emitted from a semiconductor laser.

4. The method according to claim 2, wherein said parallel beam is emitted from a light emitting diode.

5. The method according to claim 2, wherein said parallel beam is emitted from a mercury lamp.

6. The method according to claim 2, wherein said parallel beam is emitted from an argon laser.

* * * * *